US006766337B1

(12) United States Patent
Bae et al.

(10) Patent No.: US 6,766,337 B1
(45) Date of Patent: Jul. 20, 2004

(54) APPARATUS AND METHOD FOR GENERATING SPREADING CODE IN CDMA COMMUNICATION SYSTEM

(75) Inventors: Sang-Min Bae, Suwon-shi (KR); Mi-Young Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/556,757

(22) Filed: Apr. 21, 2000

(30) Foreign Application Priority Data

Apr. 21, 1999 (KR) .............................................. 99-14301

(51) Int. Cl.[7] ................................................ G06F 7/58
(52) U.S. Cl. ...................... 708/250; 708/255; 714/728; 714/781; 714/739; 375/130
(58) Field of Search ............................... 375/130, 140, 375/141, 146, 147, 343, 367; 714/728, 739, 781; 708/250, 252, 253, 255

(56) References Cited

U.S. PATENT DOCUMENTS

| | | | | |
|---|---|---|---|---|
| 5,258,936 A | * | 11/1993 | Gallup et al. ................ | 708/254 |
| 6,141,374 A | * | 10/2000 | Burns ......................... | 375/152 |
| 6,246,676 B1 | * | 6/2001 | Chen et al. .................. | 370/342 |
| 6,339,781 B1 | * | 1/2002 | Sasaki ......................... | 708/252 |
| 6,560,212 B1 | * | 5/2003 | Prasad et al. ................ | 370/335 |

FOREIGN PATENT DOCUMENTS

JP        2002-528951        9/2002

OTHER PUBLICATIONS

Japanese Office Action dated Feb. 25, 2003, issued in a counterpart application, namely, Appln. No. 2000–614589.

* cited by examiner

*Primary Examiner*—Stephen Chin
*Assistant Examiner*—Dac V. Ha
(74) *Attorney, Agent, or Firm*—Dilworth & Barrese LLP (57) ABSTRACT

A device for generating a spreading code in a CDMA communication system is disclosed. In the device, an ML (Maximal Length) sequence generator generates an ML sequence according to a generator polynomial of an ML sequence having a length $2^s-1$ and a given initial value, and reloads the initial value whenever an ML sequence having a length shorter than the length $2^s-1$ is generated, to repeatedly perform an operation of generating the ML sequence. A mask selector including first and second masks having a given offset, selects the first mask in an ML sequence period of the desired length and selects the second mask in the other period. A modulo-2 adder adds an output of the ML sequence generator and an output of the mask selector to generate the spreading code, and truncates the ML sequence upon receipt of the second mask.

6 Claims, 5 Drawing Sheets

APPARATUS AND METHOD FOR GENERATING SPREADING CODE IN CDMA COMMUNICATION SYSTEM

BACKGROUND OF THE INVENTION

1. Field of the Invention

The present invention relates generally to a device and method for generating spreading code in a CDMA communication system, and in particular, to a device and method for generating spreading code for spread spectrum.

2. Description of the Related Art

In an existing IS-95 CDMA system, spread spectrum is performed at a chip rate of 1.2288×10⁶ cps (chips per second), so that a short PN (Pseudo Noise) code is generated at the chip rate of $1.2288 \times 10^6$ cps Since the short PN code should be generated during one-frame period (80 msec/3≡26.67 msec) of a sync channel, the short PN code has a period of $2^{15}$ chips (1.2288×10⁶ cps*0.02667 sec).

Figure 1:
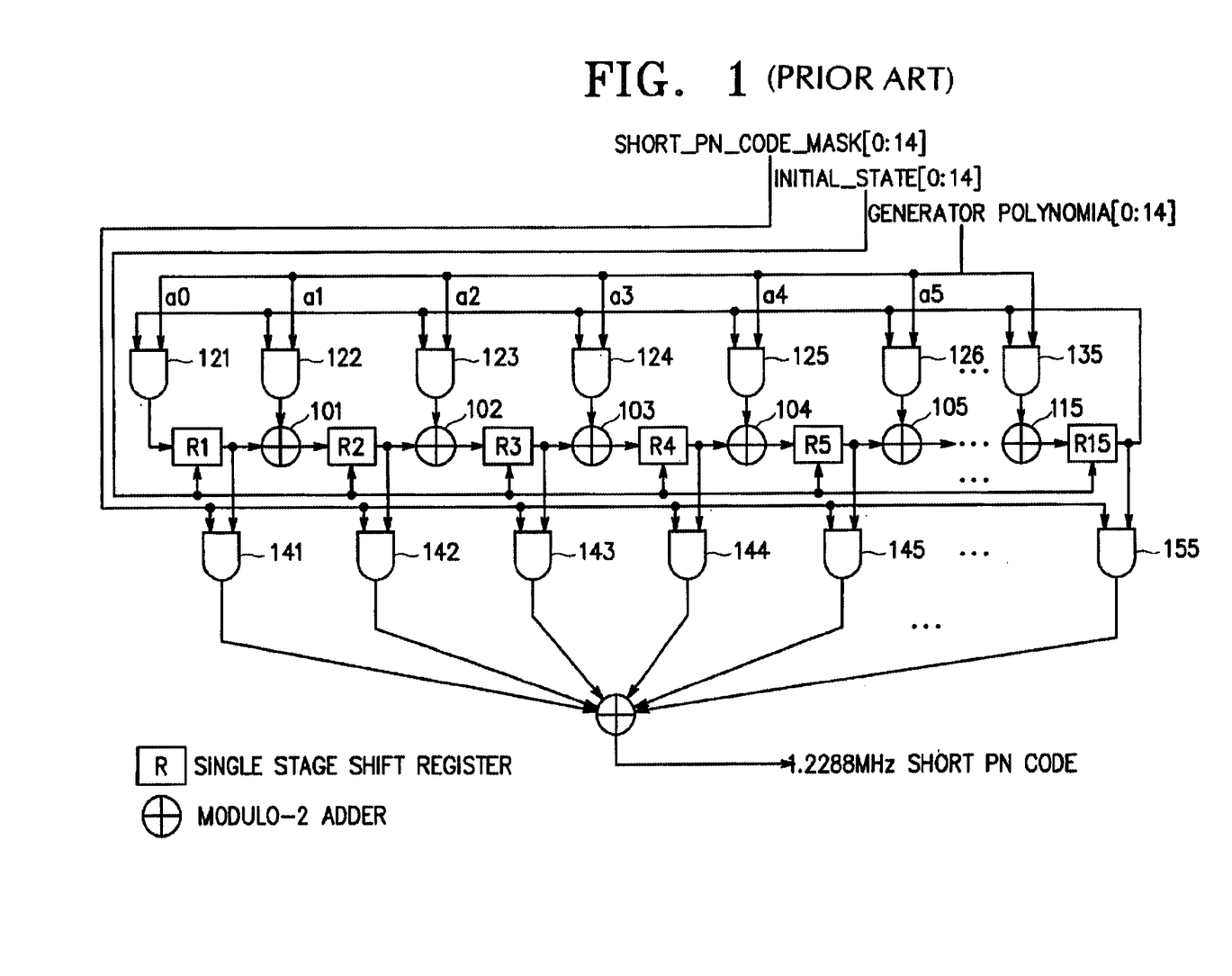
FIG. 1 is a diagram illustrating a device for generating spread spectrum spreading codes in an existing CDMA communication system.

FIG. 1 shows a conventional device for generating spreading codes. Referring to FIG. 1, the spreading code generator generates a short PN code using a generator for generating an ML sequence (M-sequence and/or Maximal-Length sequence, hereinafter the two terms will be used interchangeably) of length $2^{15}-1$. The generator is comprised of 15 shift registers labeled R1–R15. By inserting one '0' after 14 '0' sequences IS-95 standard identifies two phase channels (i.e., In-phase and Quadrature-phase channels) that use different polynomials and employ two different ML sequences.

A short PN code having a delay effect by a specific period Δ with regard to the generated short PN code can be obtained by selectively module-2 adding the shift register values of the generator polynomial. That is, in FIG. 1, modulo-2 adders 101–104 modulo-2 add outputs of their associated shift registers R1–R15 to the outputs of their associated AND gates 122–125, and provide their outputs to shift registers in the next stages. To select a shift register value for modulo-2 adding, a mask Short_PN_Code_Mask[0:14] is used. That is, different mask values are applied to generate short PN codes having a different offset (or phase difference).

A proposed IMT-2000 system based upon a CDMA-2000 system supports a wideband CDMA system having a spreading frequency bandwidth greater than 1.2288×10⁶ cps. For a short PN code used in this case, $2^S-1$ (where S is a positive number) sequences are partially selected from an ML sequence of length $2^{15} \times N$ (where N is a 3 or a multiple of 3) which is not the conventional ML sequence of $2^{15}-1$. Table 1 below shows a length of the short PN code required for each chip rate.

TABLE 1

| N | Spread Spectrum (Chip Rate) = 1.2288 × 10⁶ × N | Length (P) of Short PN Code during 1-Frame of Sync CH p = 2¹⁵ chip × N | (M-sequence Length: $2^S - 1$) |
|---|---|---|---|
| 1 | 1.2288 × 10⁶ | 2¹⁵ chip | (2¹⁵ − 1) |
| 3 | 1.2288 × 10⁶ × 3 | 2¹⁵ × 3 chip | (2¹⁷ − 1) |
| 6 | 1.2288 × 10⁶ × 6 | 2¹⁵ × 6 chip | (2¹⁸ − 1) |
| 9 | 1.2288 × 10⁶ × 9 | 2¹⁵ × 9 chip | (2¹⁹ − 1) |
| 12 | 1.2288 × 10⁶ × 12 | 2¹⁵ × 12 chip | (2¹⁹ − 1) |

Although an offset delay value for identifying the base station is applied to the generated short PN code, only the partially selected sequence should occur. However, in the conventional method in which an offset-delayed short PN code is generated by simply applying one mask, a sequence departing from the selected ML sequence period may be generated undesirably.

Figure 2:
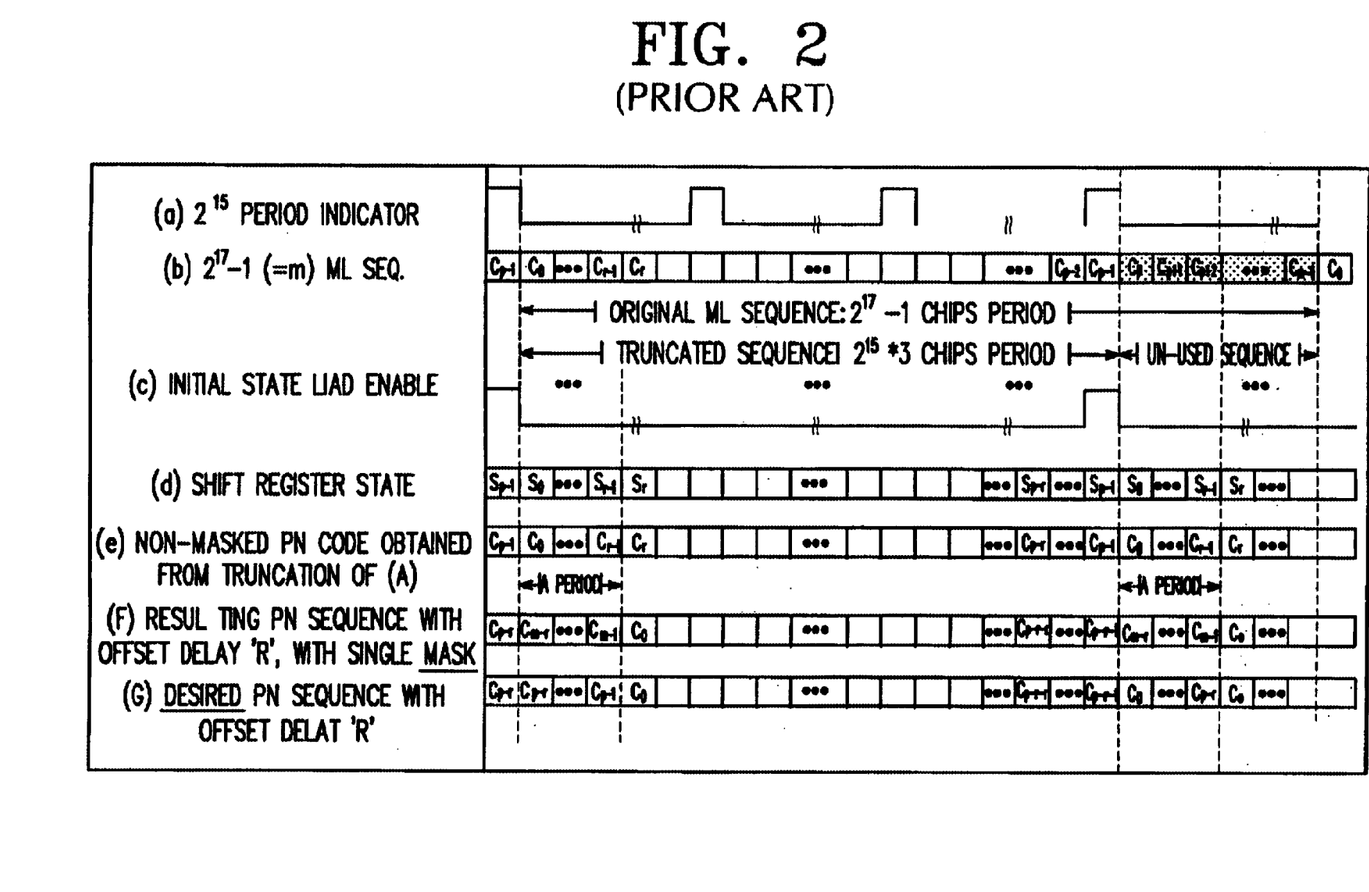
FIG. 2 is a diagram for explaining a procedure for generating a spreading code using one mask in the existing CDMA communication system.

Such problems will be described with reference to FIG. 2. FIG. 2 shows a method for determining a short PN code having a length $p=2^{15}\times 3$ from an ML sequence having a length $m=2^{17}-1$ represented by (b). Assume that the method for generating the spreading code having a length $2^{15} \times 3$ shown in FIG. 1 is expanded to generate a short PN code by selecting only the first ¾ portion from an ML sequence of length $2^{17}-1$, in which 17 shift registers are provided. Assuming that a value selected from one period value of the binary ML sequence represented by (b) is $C_0$ and a short PN code is generated by selecting sequence values of length p beginning at the sequence value $C_0$, the remaining (m−p) sequences out of the total m ML sequences correspond to an unused sequence. There is a simple method for generating the short PN code by selecting a partial period of the whole ML sequence. In this method, a present state, represented by (d), of the shift register for generating the ML sequence or a sequence output is monitored. Further, after the state of the shift register becomes $S_{p-1}$ as represented by (d) of FIG. 2, or after a (p−1)th sequence occurs, an initial state signal represented by (c) is generated to initialize the shift register so that the first sequence $C_0$ is output.

A description will be made regarding a phenomenon occurring when only one mask value Mask_r corresponding to 'r' is applied as shown in FIG. 1 to apply an offset delay 'r' to the generated short PN code represented by (e) of FIG. 2. In this case, as shown by (f) of FIG. 2, the offset delay value 'r' is applied to the ML sequence value in an A period corresponding to the sequences from $0^{th}$ sequence to an (r−1)th sequence to generate (m−r)th to (m−1)th sequence values out of the original whole ML sequence of length 'm', and generate $0^{th}$ to (p−r−1)th ML sequence vales from rth to (p−1)th ML sequences. This is because based on a unique property of the ML sequence, the offset delay value is determined according to the present shift register state and the mask value, and since a period of the original ML sequence is 'm', the offset delay occurs based on this period. Therefore, (m−r)th to (m−1)th ML sequence values belonging to the unused period occur in the A period. The presence of the sequence values in the A period is against the original intention of cyclic delaying only the original ML sequence values of $0^{th}$ sequence $C_0$ to (p−1)th sequence $C_{p-1}$. That is, to achieve the desired cyclic offset delay as represented by (g) of FIG. 2, the offset delay value 'r' is applied to 0th to (r−1)th ML sequence values $C_0$–$C_{r-1}$ so as to generate (p−r)th to (p−1)th sequence values of the original ML sequence.

As described above, when the conventional spreading code generation method generates a short PN code using only one mask, the undesired output is obtained in the A period of FIG. 2. To solve such problems, there is required a mask, Mask_(m−p+r), for further delaying by 'm−p' which corresponds to a length of the unused sequence of the original ML sequence, instead of using the mask Mask_r for delaying by 'r' in the A area.

SUMMARY OF THE INVENTION

It is, therefore, an object of the present invention to provide a device and method for generating a short PN code for spread spectrum in a CDMA communication system.

It is another object of the present invention to provide a device and method for generating a spreading code having a short period from a sequence having a long period in a CDMA communication system.

It is further another object of the present invention to provide a spreading code generation device and method which uses at least two masks in consideration of an offset so that an unused sequence period out of the whole sequence having a long period should not occur in the spreading code having the offset, in a CDMA communication system.

To achieve the above object, there is provided a device for generating a spreading code in a CDMA communication system. In the device, an ML (Maximal Length) sequence generator generates an ML sequence according to a generator polynomial of an ML sequence having a length $2^S-1$ and a given initial value, and reloads the initial value whenever an ML sequence having a length shorter than the length $2^S-1$ is generated, to repeatedly perform an operation of generating the ML sequence. A mask selector including first and second masks having a given offset, selects the first mask in an ML sequence period of the desired length and selects the second mask in the other period. An adder modulo-2 adds an output of the ML sequence generator and an output of the mask selector to generate the spreading code, and truncates the ML sequence upon receipt of the second mask.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

A CDMA communication system identifies base stations by assigning different offset delay values for a short PN code, and uncorrelates interference between multiple paths when multi-path delay occurs which is a general channel property of the mobile communication channel. With regard to the short PN code, all the mobile stations connected to one base station use the codes having the same offset delay value. When the mobile station hands off to another base station, the mobile station should use a code having different offset delay value. In particular, while a soft handoff is being performed, one mobile station may assign two or more different offset delay values to demodulation fingers of the rake receiver for the respective multi-paths to perform demodulation. Here, to generate a short PN code having a desired offset delay value, a common method applies a proper mask for the desired offset delay vale to a short PN code having an offset delay value of 'r'.

Meanwhile, in an IS-95/IS-95A or CDMA-2000 (or IS-2000) system, for the short PN code, a binary code of period 32768 chips is typically used which is obtained by adding one '0' to an ML (Maximal Length) sequence having a chip rate of 1.2288 MHz and a period of 32768 chips. A length of the binary code is identical to one-frame length (80 msec/3) of the sync channel. However, the $3^{rd}$ generation IS-2000 or UMTS CDMA systems may have a spreading frequency bandwidth wider than that of the IS-95 system. For example, in a 3×CDMA-2000 (IS-2000) system having a bandwidth of 1.2288×3=3.6864 MHz, which is three times the spreading frequency bandwidth of the IS-95 system, to maintain the constant frame length (80 msec/3) of the sync channel, there is required a short PN code having a length 32768×3. This is three times the length of the existing IS-95 short PN code. That is, in the wideband communication system having a wider spreading bandwidth than the existing CDMA communication system, a period of the desired short PN code varies according to applied bands. However, when the ML sequence is used for the short PN code as in the existing IS-95 system, the full period is always $2^S$ (where S is an integer); although the period of the ML sequence is always $2^S-1$, one '0' is added to make the period become $2^S$ in a CDMA system, for convenience of implementation) based on the theoretical property of the ML sequence. Therefore, when the period of the desired short PN code is $2^{15}×N$ (where N is 3 or a multiple of 3), it is not possible to use the short PN code comprised of the full period of the ML sequence and instead, a partial period of the ML sequence of period $2^{15}×N$ (where N is 3 or a multiple of 3) should be used.

However, when the short PN code is comprised of only a partial period of the ML sequence, the following problems occur. That is, as stated above, when a mask is simply applied as in the conventional method to generate a short PN code having a specific offset delay value, the generated code includes even the undesired period which is not the desired partial period of the ML sequence. Accordingly, the present invention proposes a method for generating a short PN code having a desired offset delay value, in the case where for a length of the desired short PN code, a partial period should be selected from the theoretical full period of the ML sequence. Although the invention will be described with reference to the IS-95 and IS-2000 systems for convenience of explanation, it will be understood by those skilled in the art that the invention can be applied to every system in which the short PN code is comprised of the partial period of the ML sequence.

Figure 3:
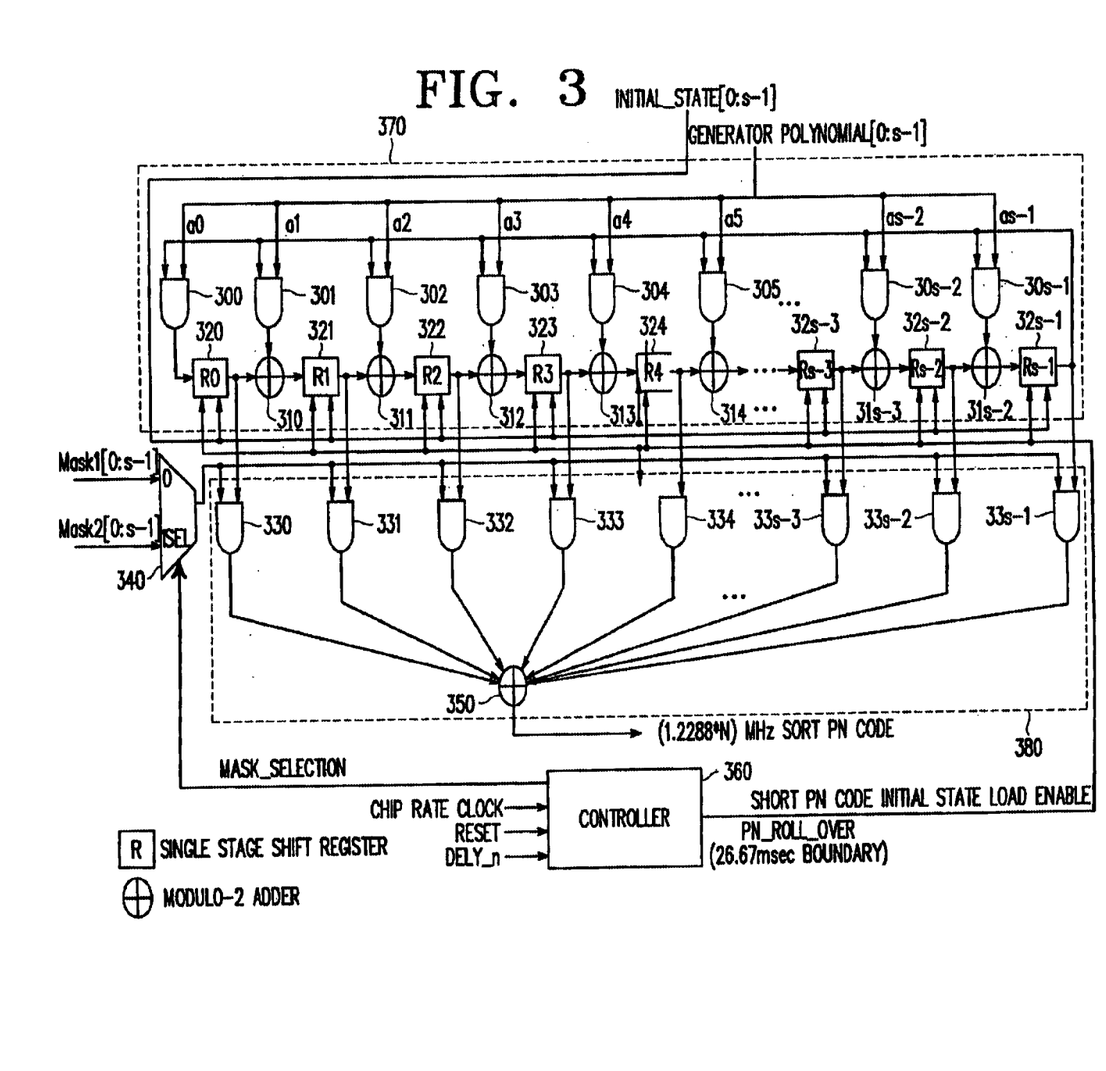
FIG. 3 is a diagram illustrating a device for generating spread spectrum spreading codes in a CDMA communication system according to an embodiment of the present invention.

FIG. 3 shows a device for generating a spreading code having a chip period of 32768×N (N=3,6,9,12) according to an embodiment of the present invention.

Referring to FIG. 3, registers 320 to 32s–1 constitute a shift register. The registers 320 to 32s–1 are initialized by an initial state value INITIAL_STATE[0:s–1]. The output value $R_{s-1}$ of the register 32s–1 is provided to AND operators 300 to 30s–1. The AND operators 300 to 30s–1 AND the output of the register 32s–1 with their associated coefficients a0 to as–1 of the generator polynomial. Adders 310 to 31s–2 connected between the registers, modulo-2 add the outputs of the AND operators 301 to 30s–1 and the outputs of the previous stages and then store the resulting values to the registers in the next stages.

A controller 360 generates a PN_ROLL_OVER signal for controlling the period 32768×N, and a mask select signal for selecting a corresponding mask. A multiplexer 340 receiving a first mask Mask1[0:s−1] and a second mask Mask2[0:s−1], selects a mask signal according to the mask select signal output from the controller 360. AND gates 330 to 33s−1 each AND the output values $R_0$ to $R_{s−1}$ of registers 320 to 32s−1 with the mask signal selected by the multiplexer 340. An exclusive OR operator 350 XORs the output values of the AND operators 330 to 33s−1 to generate a short PN code.

Referring to FIG. 3, the spreading code generator according to an embodiment of the present invention includes an ML sequence generator 370 and the controller 360. The ML sequence generator 370 generates an ML sequence which can reload the initial shift register values $R_0$ to $R_{s−1}$ according to the generator polynomial of the ML sequence in order to generate a PN code generator which truncates a desired period from the spreading code of length $2^S−1$ (where S is the number of the shift registers) generated by the ML sequence generator and repeatedly generates the truncated period. The controller 360 selects the desired length of the spread spectrum spreading code from the whole spreading code of the generated ML sequence.

Further, the spreading code generator includes the modulo-2 adders 310 to 31s−2 and the selector 340, in order to generate a spreading code having a specific offset with regard to the selected spreading code. The modulo-2 adders 310 to 31s−2 selectively modulo-2 add the output values of the shift registers 320 to 32s−1 according to the mask value to generate an offset-delayed spreading code having a specific offset with respect to the generated original spreading code. The selector 340 selects one of the two mask values to generate the spreading code.

Figure 4:
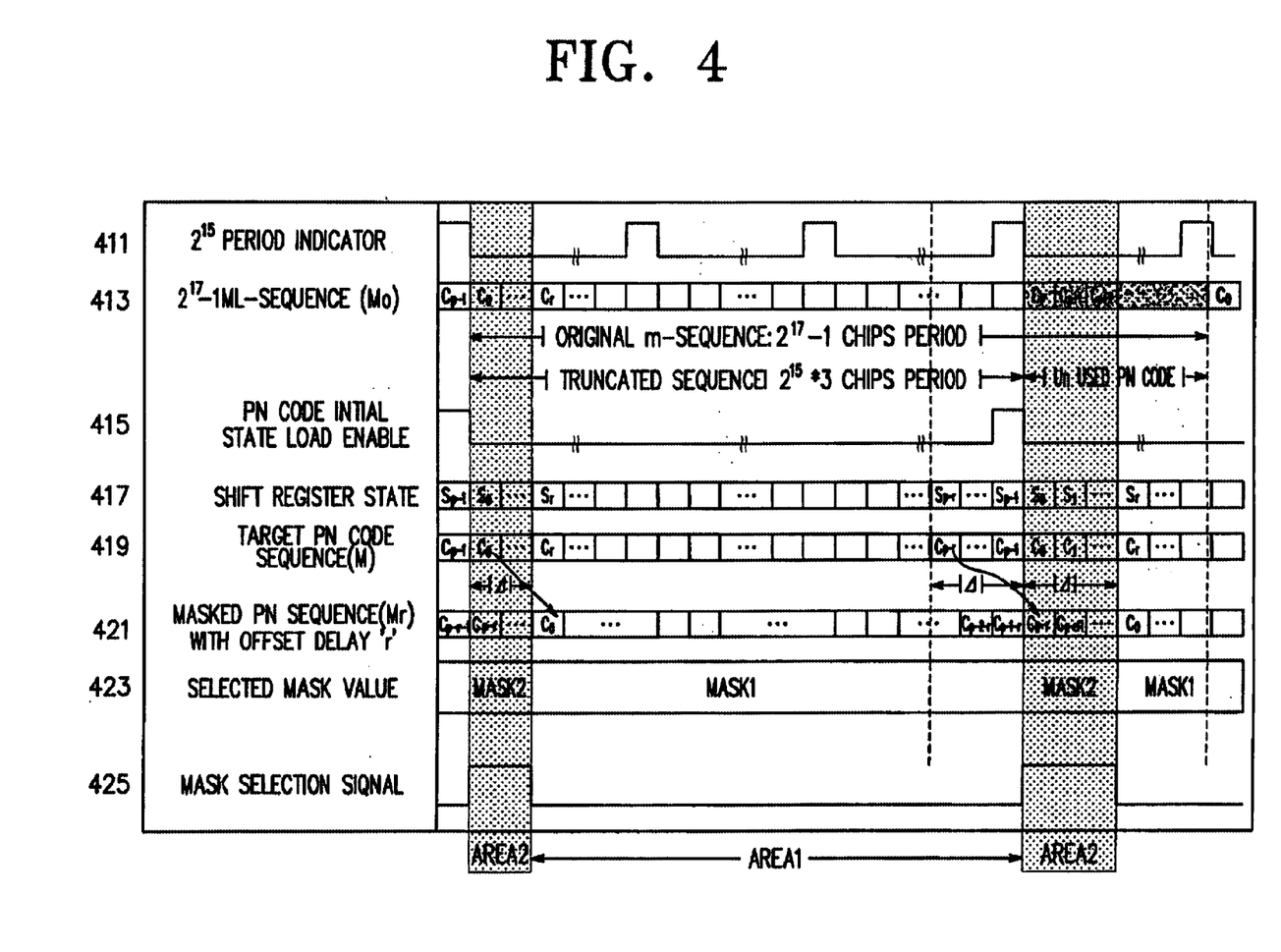
FIG. 4 is a timing diagram for generating spreading codes in the spreading code generation device of FIG. 3.

FIG. 4 shows a timing diagram for generating a short PN code of chip period $2^{15}×3$ according to an embodiment of the present invention.

The invention will be described with reference to an example wherein a short PN code of chip period $p=2^{15}×3$ is generated when a spreading band has a chip rate of $1.2288×10^6×3$.

Referring to FIGS. 3 and 4, to generate a short PN code of chip period $p=2^{15}×3$, an ML sequence generator having a minimum period of $2^{17}−1$ can be used. A generator polynomial of the ML sequence generator can be expressed as shown in Equation (1) below.

$$P(x)=x^{17}+a16.x^{16}$$
$$+a15.x^{15}+a14.x^{14}+a13.x^{13}$$
$$+a12.x^{12}+a11.x^{11}$$
$$+a10.x^{10}+a9.x^9+a8.x^8$$
$$+a7.x^7+a6.x^6+a5.x^5+a4.x^4+a3.x^3$$
$$+a2.x^2+a1.x^1+a0 \quad \text{[Equation 1]}$$

In Equation (1), 'an' (where n=0,1, . . . , 16) is a coefficient of the generator polynomial and has a value of '0' or '1'. This can be implemented using 17-stage shift registers $R_0$ to $Rs_{S−1}$ and modulo-2 adders 310 to 31s−2 as in the ML sequence generator 370 of FIG. 3. The initial values 0 to s−1 of the 17-stage register in the ML sequence generator 370 should be reloadable. This is because the spreading code of chip period $2^{15}×3$ can be generated by continuously reloading the initial values of the 17-stage register in the ML sequence generator 370 every $2^{15}×3$ chip.

The spreading code generator requires a control signal generator for generating a control signal (i.e., a short PN code initial state load enable signal) for reloading the initial state value of the 17-stage register. The control signal is generated by the controller 360. The controller 360 can generate the control signal by using a counter having a period $p=2^{15}×3$ and providing a device for comparing the values of the shift registers $R_0$ to $R_{S−1}$. The method using the values of the shift registers $R_0$ to $R_{S−1}$ generates the control signal (i.e., short PN code initial state load enable signal) to reload an initial state $S_0$ when a state value of the shift register is $S_{p−1}$, as shown in FIG. 4. In this manner, it is possible to generate a short PN code of period $p=2^{15}×3$ from the ML sequence generator 370 having a period $m=2^{17}−1$.

With respect to the short PN code determined in the above-stated method, the short PN code having a specific offset can be generated by selectively modulo-2 adding the state values of the shift registers, and this can be implemented by the block 380 of FIG. 3. Selection of the modulo-2 added value from the shift register is determined according to a mask value, and different mask values are required according to the desired offset.

In the embodiment of the present invention, the short PN code of period $2^{15}×3$ is determined by truncating the M-sequence of period $2^{17}−1$. When the short PN code having an offset is generated using the mask, consideration should be given to the unused codes out of the generated codes. Considering this, the embodiment of the present invention includes at least two types of mask sets: Mask1 and Mask2. That is, the embodiment of the present invention includes two masks to apply a first mask to an M sequence in a first period and a second mask to an M sequence in a second period, so that it is possible to generate one short PN code using the masks having different offsets.

Such mask operation is performed by the selector 340, and the selector 340 is controlled by the controller 360. The controller 360 maintains selection of a specific mask before a length of the generated the spreading code becomes the desired offset value 'r' of the generated spreading code, and generates a mask select signal for selecting the other mask when the length exceeds the offset value 'r' (i.e., when a spreading code of the desired length is generated).

A detailed description of the mask selection process will be described below. When the untruncated original ML sequence show by 413 of FIG. 4 is $M_o$, the spreading code M represented by 419 of FIG. 4 is determined by truncating the sequence $M_o$ at $p=2^{15}×3$. A masked PN sequence $M_r$, represented by 421 of FIG. 4, having an offset 'r' from the spreading code M is available by combining the output values of the shift register of a generator for generating the code M represented by 419 with a mask (Mask1 in the embodiment) required for phase delay (or offset) 'r'. Here, when the Mask1 is used for the code value $M=[C_0:C_{r−1}]$, the code values $[C_p:C_m]$ of the unused period of the original code $M_o$ are generated undesirably. Therefore, in the embodiment, in this period $[C_o:C_{r−1}]$, the Mask2 is used which causes the offset of 'r+m−p' rather than 'r'.

Figure 5:
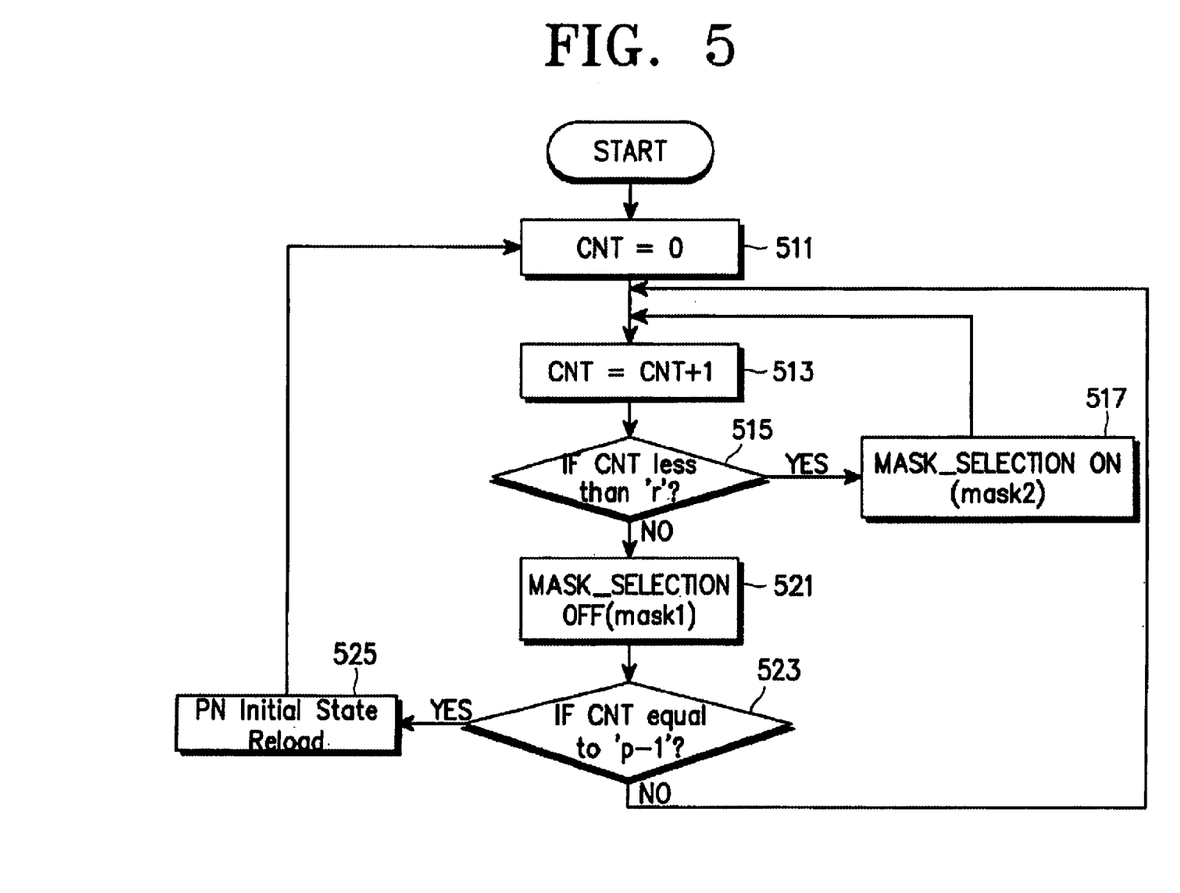
FIG. 5 is a diagram illustrating a procedure for generating a mask select signal and an M-sequence reload signal.

FIG. 5 shows a procedure for generating a mask select signal and an initial state load enable signal in the controller 360 of FIG. 3.

Referring to FIG. 5, a count value CNT includes a state of the ML sequence and an index for an output value, and a given state desired by the user is assumed to be a $0^{th}$ state. The controller 360 initializes the count value CNT to '0' in step 511, and then increases the count value CNT by one each time the clock is generated, in step 513. Thereafter, the controller 360 compares the count value CNT with the offset value 'r' in step 515. When the count value CNT is lower than the offset value 'r', the controller 360 proceeds to step 517 and enables a mask select signal to select Mask2. Otherwise, the controller 360 proceeds to step 521 and disables the mask select signal to select Mask1. The selector 340 then selects Mask1 or Mask2 according to the mask select signal from the controller 360. The mask select signal provided to the selector 340 is shown by 425 of FIG. 4, and the mask output from the controller 360 is shown by 423 of FIG. 4. The mask output from the selector 340 is provided to the AND gates 330 to 33s-1.

After selecting Mask1 in step 521, the controller 360 determines in step 523 whether the count value CNT is equal to a length (p-1) of the desired short PN code. When the count value CNT is not equal to the length of the desired spreading code, the controller 360 returns to step 513 to repeat the above operation. However, when the count value CNT is equal to the length of the desired spreading code, the controller 360 generates an initial state reload signal and provides the generated signal to the M-sequence generator 370, in step 525. The M-sequence generator 370 then loads the initial state value INITIAL_STATE[0:s-1] and returns to the initial state of the ML sequence.

As described above, the novel spreading code generator generates a short PN code of desired length by operating the ML sequence of the desired length and the first mask from a spreading code of length $2^S-1$ generated by the ML sequence generator and performs truncation by operating the ML sequence of the unused period and the second mask having a specific offset with the first mask, so as to generate a spreading code having a length of the short PN code during one frame of the sync channel. Therefore, the short PN code is generated by repeating the above process. At this point, a partial period of the ML sequence should be selected in consideration of partial correlation of the spreading code and distribution balance of the binary value. In addition, it is possible to generate a spreading code having a specific offset with respect to the spreading code partially selected from the ML sequence.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A device for generating a spreading code in a CDMA (Code Division Multiple Access) communication system, comprising:
   a sequence generator for generating a sequence according to a generator polynomial of a sequence having a length $2^S-1$, and a given initial value, and reloading the initial value whenever a sequence having a length shorter than the length $2^S-1$ is generated, to repeatedly perform an operation of generating the sequence, where S is a positive number;
   a mask selector including first and second masks having a given offset, for selecting the first mask in a sequence period and selecting the second mask in another sequence period; and
   an adder for modulo-2 adding an output of the sequence generator and an output of the mask selector to generate the spreading code, and truncating the sequence upon receipt of the second mask.

2. A spreading code generating device for a CDMA communication system, which generates a spreading code having a length shorter than a length $2^S-1$ from a sequence having the length $2^S-1$, where S is a positive number, the device comprising:
   a sequence generator for generating a sequence according to a generator polynomial of a sequence having a length $2^S-1$ and a given initial value, and reloading the initial value upon receipt of a reload control signal to repeatedly perform an operation of generating the sequence;
   a controller for analyzing a length of the generated sequence, and generating the reload control signal and a mask select signal when the sequence of desired length is generated;
   a mask selector including first and second masks having a given offset, for selecting the second mask upon receipt of the mask select signal; and
   an adder for modulo-2 adding an output of the sequence generator and an output of the mask selector to generate the spreading code, and truncating the sequence upon receipt of the second mask.

3. A spreading code generating method for a CDMA communication system, which generates a spreading code having a length shorter than a length $2^S-1$ from an sequence having the length $2^S-1$, where S is a positive number, the method comprising the steps of:
   generating a sequence according to a generator polynomial of a sequence having a length $2^S-1$ and a given initial value;
   adding, using modulo-2 addition, the generated sequence and a first masks to generate the spreading code;
   analyzing a length of the generated sequence, reloading the initial value whenever the sequence of desired length is generated;
   adding, using modulo-2 addition, a second mask having a given offset with the first mask; and
   truncating the generated sequence.

4. A device for generating a spreading code in a CDMA (Code Division Multiple Access) communication system, comprising:
   a sequence generator for generating a Maximum Length (ML) sequence according to a generator polynomial of a sequence having a length $2^S-1$, and a given initial value, and reloading the initial value whenever a sequence having a length shorter than the length $2^S-1$ is generated, to repeatedly perform an operation of generating the sequence, where S is a positive number;
   a mask selector for selecting a first mask before the generated ML sequence length reaches a phase difference value between the ML sequence having a length $2^S-1$ and the ML sequence of the desired length having a length shorter than the length $2^S-1$ and selecting a second mask after reaching the value; and
   an adder for modulo-2 adding an output of the sequence generator and an output of the mask selector to generate the spreading code, and truncating the sequence upon receipt of the second mask.

5. A spreading code generating device for a CDMA communication system, which generates a spreading code having a length shorter than a length $2^S-1$ from a sequence having the length $2^S-1$, where S is a positive number, the device comprising:
   a sequence generator for generating a sequence according to a generator polynomial of a sequence having a length $2^S-1$ and a given initial value, and reloading the initial value upon receipt of a reload control signal to repeatedly perform an operation of generating the sequence;
   a controller for generating a reload control signal when a Maximum Length (ML) sequence of a desired length is generated by analyzing a length of the generated ML sequence, generating a first mask selecting signal for selecting the first mask before the generated ML sequence length reaches a phase difference value [r] between the ML sequence having a length $2^S-1$ and the ML sequence of the desired length, and generating a second mask selector signal for selecting the second mask after reaching the value;

a mask selector including first and second masks having a given offset, for selecting the second mask upon receipt of the mask select signal; and an adder for modulo-2 adding an output of the sequence generator and an output of the mask selector to generate the spreading code, and truncating the sequence upon receipt of the second mask.

6. A spreading code generating method in a CDMA communication system, generating a spreading code having a length shorter than a length $2^S-1$ from Maximum Length (ML) sequence having the length $2^S-1$, where S is a positive number, the method comprising the steps of:

generating the ML sequence having a length $2^S-1$;

generating a first mask for selecting the ML sequence of a desired length having a length shorter than a length $2^S-1$ and a second mask for truncating the ML sequence of the other length, which is not selected by the first mask in a length $2^S-1$;

selecting the second mask in a pseudo noise (PN) offset period within an ML sequence period and selecting the first mask in another period;

modulo-2 adding the generated ML sequence and the selected first and second masks; and generating the added signal as the spreading code.

* * * * *